(12) United States Patent
Pedersen

(10) Patent No.: US 7,864,620 B1
(45) Date of Patent: Jan. 4, 2011

(54) PARTIALLY RECONFIGURABLE MEMORY CELL ARRAYS

(75) Inventor: Bruce B. Pedersen, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 70 days.

(21) Appl. No.: 12/407,750

(22) Filed: Mar. 19, 2009

(51) Int. Cl.
*G11C 8/00* (2006.01)

(52) U.S. Cl. .............. 365/230.06; 365/154; 365/189.16

(58) Field of Classification Search ................. 365/154, 365/156, 185.05, 185.23, 230.06, 230.08, 365/189.16
See application file for complete search history.

(56) References Cited

U.S. PATENT DOCUMENTS

| | | | |
|---|---|---|---|
| 3,824,564 A * | 7/1974 | Wegener | 365/184 |
| 6,020,758 A | 2/2000 | Patel | |
| 6,057,704 A | 5/2000 | New | |
| 6,091,263 A | 7/2000 | New | |
| 6,459,641 B2 * | 10/2002 | Fujioka et al. | 365/220 |
| 6,462,998 B1 * | 10/2002 | Proebsting | 365/205 |
| 6,952,368 B2 * | 10/2005 | Miura et al. | 365/185.11 |

OTHER PUBLICATIONS

Lui, Lin-Shih et al. "Intengrated Circuits with Clearable Memory Elements." U.S. Appl. No. 12/057,343, filed Mar. 27, 2008.
Chan, Mark T. et al. "Integrated Circuit Memory Elements." U.S. Appl. No. 12/057,339, filed Mar. 27, 2008.

* cited by examiner

*Primary Examiner*—Gene N. Auduong
(74) *Attorney, Agent, or Firm*—Treyz Law Group; G. Victor Treyz; Nancy Y. Ru

(57) ABSTRACT

Partial reconfiguration techniques and reconfiguration circuitry are provided that allow portions of a memory cell array to be reconfigured with new reconfiguration data without disturbing other portions of the memory cell array. The memory cells may be loaded with configuration data on an integrated circuit such as a programmable logic device. Memory cell outputs may configure programmable logic. To avoid disturbing programmable logic operations for programmable logic that is unaffected by the reconfigured cells during reconfiguration, unaffected memory cells are not unnecessarily cleared. Only those memory cells that need to be cleared to conform to the new configuration data that is being loaded into the array need to be loaded with logic zero values during reconfiguration operations. After these clearing operations are complete, set operations may be performed to convert appropriate memory cells to logic one values to match the new configuration data.

30 Claims, 11 Drawing Sheets

|   | ClearEnable | SetEnable | Dout | DATA | NDATA | MEMORY CELL STORED VALUE |
|---|---|---|---|---|---|---|
| A | 0 | 0 | 0 | 1 | 1 | UNDISTURBED |
| B | 0 | 0 | 1 | 1 | 1 | UNDISTURBED |
| C | 1 | 0 | 0 | 0 | 1 | 0 |
| D | 1 | 0 | 1 | 1 | 1 | UNDISTURBED |
| E | 0 | 1 | 0 | 1 | 1 | UNDISTURBED |
| F | 0 | 1 | 1 | 1 | 0 | 1 |
| G | 1 | 1 | 0 | 0 | 1 | 0 |
| H | 1 | 1 | 1 | 1 | 0 | 1 |

FIG. 8

BITSTREAM        1 0 0 1 0 1 | 1 0 1 0 1 0 1 | 1 0 1 0 1
Dout, PHASE I    1 1 1 1 1 1 | 1 0 1 0 1 0 1 | 1 1 1 1 1
Dout, PHASE II   0 0 0 0 0 0 | 1 0 1 0 1 0 1 | 0 0 0 0 0

FIG. 11

PARTIALLY RECONFIGURABLE MEMORY CELL ARRAYS

BACKGROUND

This invention relates to integrated circuit memory cell arrays, and more particularly, to the partial reconfiguration of memory cell arrays in integrated circuits such as programmable logic devices.

Programmable logic devices are a type of integrated circuit that can be programmed by a user to implement a desired custom logic function. Programmable logic devices have programmable logic that may contain programmable elements that are used to store configuration data supplied by the user. Once loaded, programmable elements supply control signals to transistors in the programmable logic in order to configure the programmable logic to implement the desired logic function. Programmable elements may be memory cells in an array.

Configuration data may be supplied to the programmable logic device in the form of a configuration bit stream. After a first configuration bit stream has been loaded onto a programmable logic device, the programmable logic device may be reconfigured by loading a different configuration bit stream in a process known as reconfiguration. An entire set of configuration data is often loaded during reconfiguration. However, it would sometimes be advantageous to reconfigure only a portion of the configuration bits in a process known as partial reconfiguration. It may also be advantageous to allow other portions of the programmable logic to continue to continue operating ("operate through") during the partial reconfiguration process.

It would therefore be desirable to be able to provide an integrated circuit memory cell array that allows partial reconfiguration to be performed while at the same time allowing the non-partially-reconfigured blocks and routing to "operate-through" the partial reconfiguration process.

SUMMARY

In accordance with the present invention, programmable elements with partial reconfiguration circuitry are provided for integrated circuits such as programmable logic devices.

Programmable elements may be memory cells that are arranged in arrays. Memory cells in the arrays may be configuration random-access-memory (CRAM) cells that receive an address signal and two data signals. A logic value may be stored in a memory cell when the address signal is asserted and the two data signals are true and complementary data signals. The memory cells may have transistors that are sized so that when the two data signals are both logic high, no logic value is loaded into the memory cell, even if the address line is asserted. In such a situation, a memory cell would retain a previously loaded logic value.

Data register circuitry is provided that supplies data signals to memory cells. The data register circuitry has a control block that provides configuration control signals and data line circuitry that has configuration logic circuitry that receives configuration control signals. In response to the configuration control signals, the data line circuitry drives both data signals high for those memory cells that should remain undisturbed. These undisturbed memory cells may continue operating while configuration data is being written into other memory cells.

Methods are provided for the partial reconfiguration of memory cell arrays. Partial reconfiguration of memory cells may be performed in two phases. In a first phase, a logic 0 is written into each memory cell that is to receive a logic 0 in the incoming configuration data bitstream. In a second phase, a logic 1 is written to each memory cell that is to receive a logic 1 in the incoming configuration data bitstream. This partial reconfiguration process allows a memory cell array to be partially reconfigured while avoiding the occurrence of conflicting signals between memory cells storing previous and incoming data. Memory cells that are to retain their previously loaded configuration data remain undisturbed and may continue operating during the partial reconfiguration process.

Further features of the invention, its nature, and various advantages will be more apparent from the accompanying drawings and the following detailed description.

BRIEF DESCRIPTION OF THE DRAWINGS

FIG. 8 is a table showing logic values stored in memory cells for given configuration control signals and data signals in accordance with an embodiment of the present invention.

FIG. 11 is a chart showing values for data signals during a partial reconfiguration of a memory cell array in accordance with an embodiment of the present invention.

DETAILED DESCRIPTION

The present invention relates to partially reconfigurable memory cell arrays on integrated circuits.

The reconfigurable memory cell arrays may be used on any suitable integrated circuit. The integrated circuits on which reconfigurable memory cell arrays are used may be memory chips, digital signal processing circuits with memory arrays, microprocessors, application specific integrated circuits with memory arrays, programmable logic device integrated circuits in which memory elements are used for configuration memory, or any other suitable integrated circuit. For clarity, the present invention will generally be described in the context of programmable logic device integrated circuits.

Figure 1:
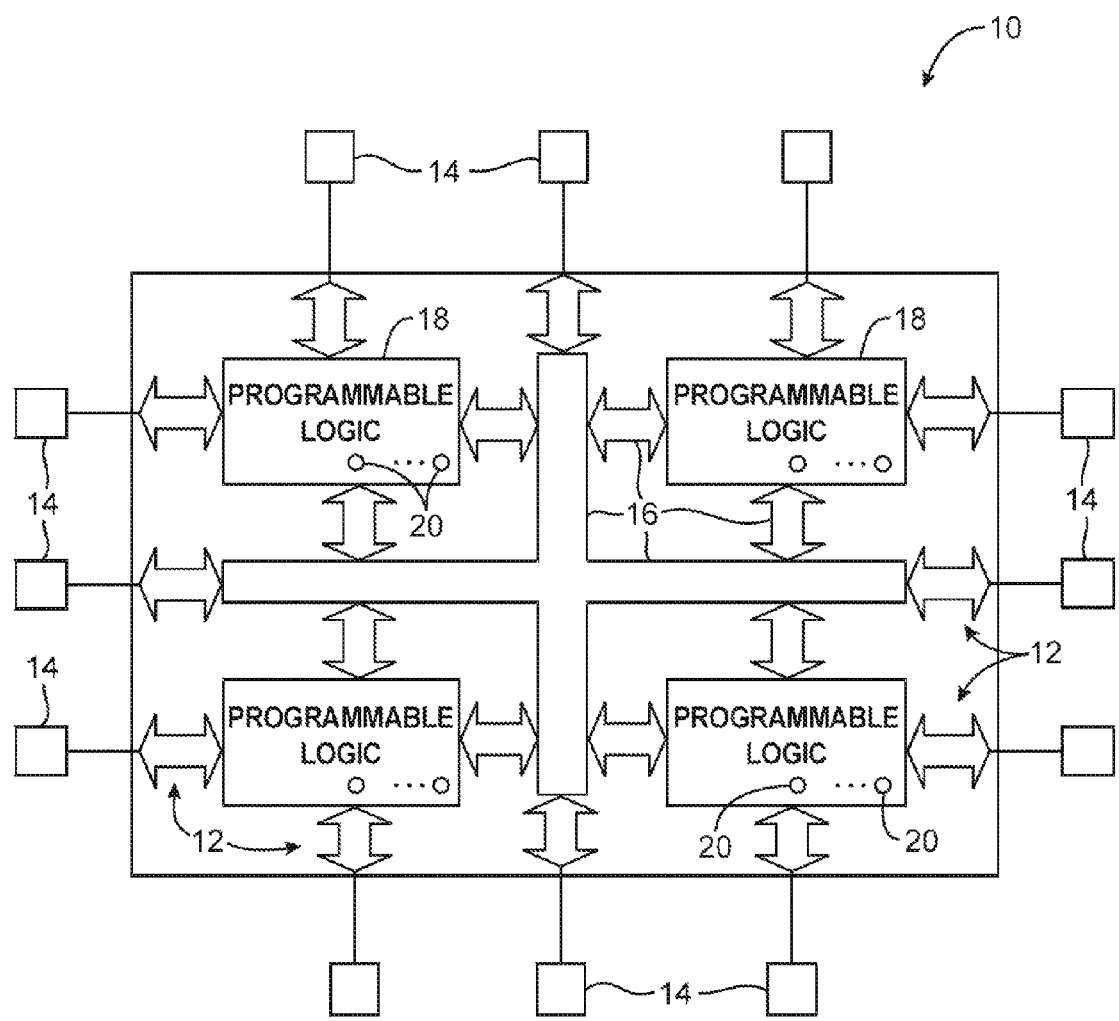
FIG. 1 is a diagram of an illustrative programmable logic device in accordance with an embodiment of the present invention.

An illustrative programmable logic device 10 in accordance with an embodiment of the present invention is shown in FIG. 1. The circuitry of device 10 may be organized using any suitable architecture. As an example, the programmable logic 18 of programmable logic device 10 may be organized in a series of rows and columns of larger programmable logic regions each of which contains multiple smaller logic regions. Programmable logic device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains memory elements 20 (also known as memory cells 20 or programmable elements 20) that can be loaded with configuration data (also called programming data or configuration bits) using pins 14 and input/output circuitry 12. The configuration data that is loaded may be in the form of a configuration bitstream. In the context of programmable logic device integrated circuits, the memory elements store configuration data and are therefore sometimes referred to as configuration random-access memory (CRAM) cells. One configuration bit may be stored in each CRAM cell. Once loaded, the memory elements each provide a corresponding static control output signal that controls the state of an associated logic component in programmable logic 18. The memory element output signals are typically used to control the gates of metal-oxide-semiconductor (MOS) transistors.

Most of these transistors are generally n-channel metal-oxide-semiconductor (NMOS) pass transistors in programmable components such as multiplexers. When a memory element output is high, the pass transistor controlled by that memory element is turned on and passes logic signals from its input to its output. When the memory element output is low, the pass transistor is turned off and does not pass logic signals.

Figure 2:
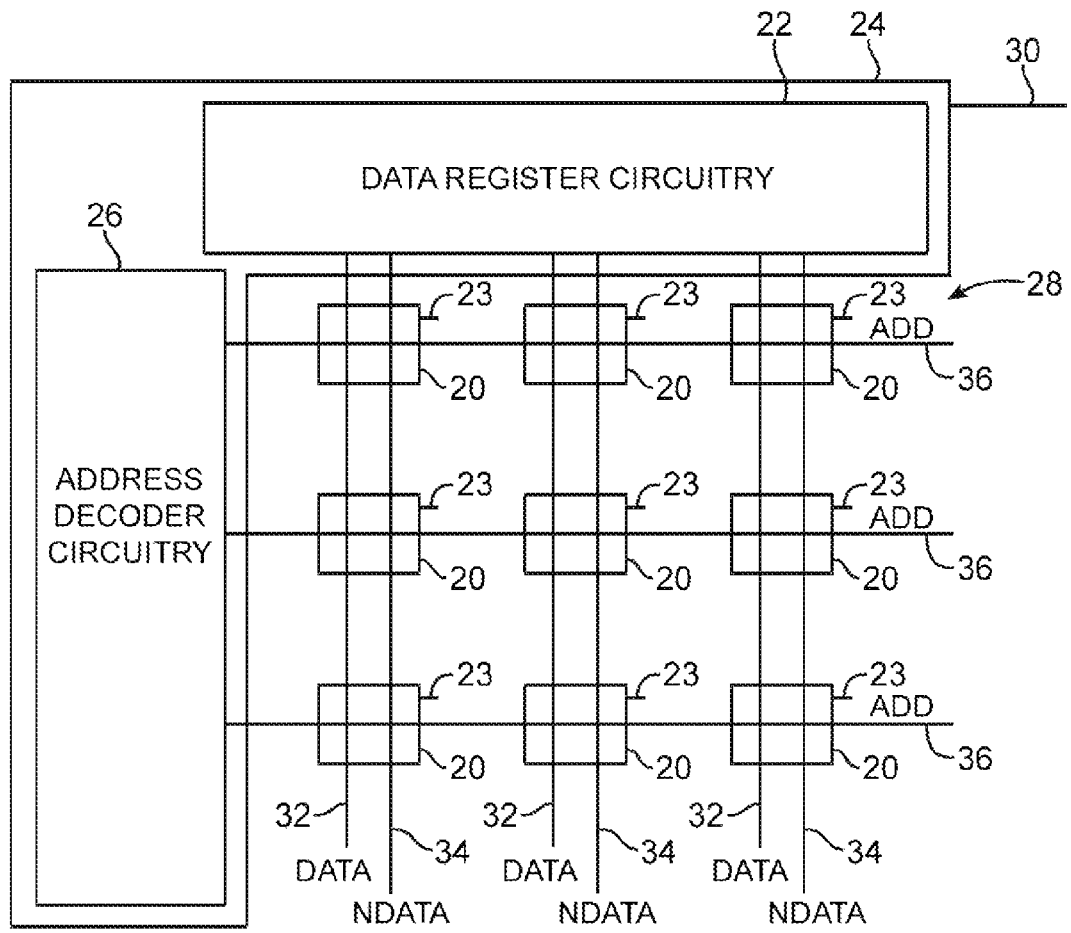
FIG. 2 is a diagram of an array of programmable logic device memory cells in accordance with an embodiment of the present invention.

An architecture that may be suitable for using memory elements 20 in programmable logic device 10 is shown in FIG. 2. Memory cell array 28 may include rows and columns of memory cells 20. In the example of FIG. 2, there are three rows and three columns of memory elements 20 in array 28. This is merely illustrative. Integrated circuits such as integrated circuit 10 may have any suitable number of memory elements 20. A typical memory cell array might, as an example, have thousands or millions of memory elements 20 arranged in hundreds or thousands of rows and columns. Each memory cell may have an output 23 from which an output signal may be applied to programmable logic 18 (see, e.g., FIG. 1).

Circuitry 24 may control data loading (data writing) operations for array 28. Circuitry 24 may have data register circuitry 22 and address decoder circuitry 26. Circuitry 24 may receive data such as configuration data from external sources via input path 30. Configuration data may be loaded in series into registers such as registers in data register circuitry 22. These registers may then apply the configuration data to array 28 over data lines 32 and 34. In single-line scenarios, data signal DATA is conveyed over a single line 32 in each column. In differential schemes, each column of memory elements 20 has an associated pair of lines 32 and 34, which typically carry a true data signal DATA and its complement NDATA. The present invention is sometimes described in the context of arrangements in which each column of memory elements 20 has a pair of data lines 32 and 34.

Address decoder circuitry 26 may receive external control signals or addressing control signals can be generated internally. The address decoder circuitry can then systematically assert desired address lines 36. Address lines 36 carry address signals ADD and are typically controlled independently in each row. As an address line 36 is asserted (i.e., as the signal ADD in a given row is taken high), the data on the data lines 32 and 34 is loaded into the memory elements 20 in that row. By addressing each row in this way, the entire array 28 may be loaded with configuration data.

Figure 3:
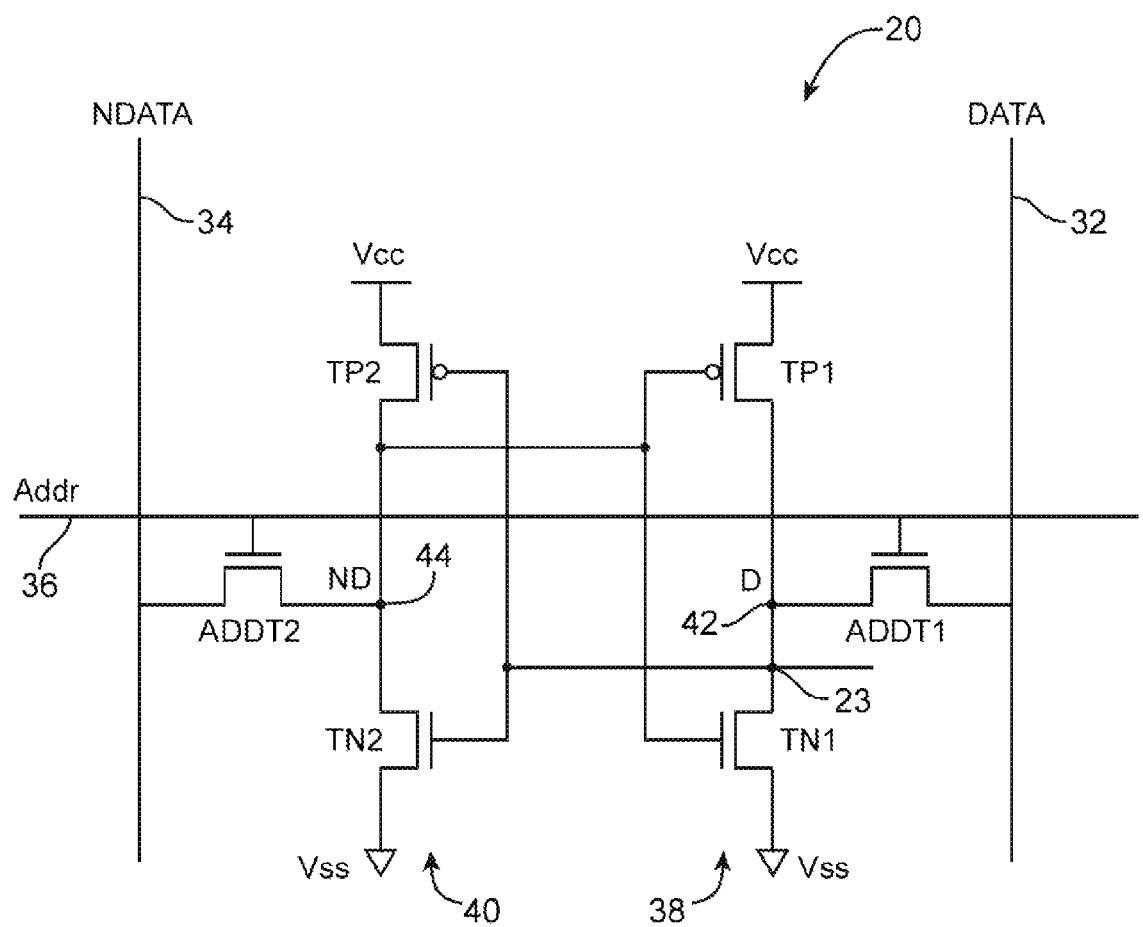
FIG. 3 is a diagram of a configuration random-access-memory cell with true and complementary data lines in accordance with an embodiment of the present invention.

Memory elements 20 may static random access memory (SRAM) cells. In programmable logic device integrated circuits, SRAM cells may serve as configuration random access memory (CRAM) cells that store configuration data. Memory elements 20 (also known as programmable elements 20 and configuration elements 20) need not be SRAM cells but could be other types of programmable elements such as such as erasable programmable read only memory (EPROM) or phase-change memory cells. Applicant's invention will generally be described in terms of SRAM and CRAM cells for illustrative purposes. SRAM and CRAM cells may be based on cross-coupled inverters (latches) or other circuit elements formed from n-channel metal-oxide-semiconductor (NMOS) and p-channel metal-oxide-semiconductor (PMOS) transistors. A pair of cross-coupled inverters (or other circuit elements) forms a bistable element for each memory cell. An illustrative memory cell 20 that is based on two cross-coupled inverters (latches) formed from NMOS and PMOS transistors is shown in FIG. 3. As shown in FIG. 3, memory element 20 is based on two cross-coupled inverters 38 and 40. Inverter 38 is formed from PMOS transistor TP1 and NMOS transistor TN1. PMOS transistor TP1 is connected between positive voltage Vcc and node 42, whereas NMOS transistor TN1 is connected between node 42 and ground voltage Vss. Inverter 40 is formed from PMOS transistor TP2 and NMOS transistor TN2. PMOS transistor TP2 is connected between positive voltage Vcc and node 44. NMOS transistor TN2 is connected between node 44 and ground voltage Vss. Collectively, transistors TN1, TN2, TP1, and TP2 may be referred to as "latch" transistors. Memory cell 20 may have a logic value D stored on node 42, and a logic value ND stored on node 44. Logic value ND is complementary to logic value D.

When logic value D is logic 0, memory cell 20 may be said to be storing logic 0. When logic value D is logic 1, memory cell 20 may be said to be storing logic 1. Writing a logic 0 to memory cell 20 may be referred to as "clearing" memory cell 20. Writing a logic 1 to memory cell 20 may be referred to as "setting" memory cell 20. During normal operation, the signal on output terminal 23 may be applied to programmable logic 18 (see, e.g., FIG. 1) such as the gate of a transistor to configure device 10.

During data loading operations, data signal DATA may be supplied to memory cell 20 on data line 32 and data signal NDATA may be supplied to memory cell 20 on data line 34. Typically, data signals DATA and NDATA have complementary values. An NMOS address transistor ADDT1 may be connected between true data line 32 and node 42. An NMOS address transistor ADDT2 may be connected between complementary data line 34 and node 44. An address signal ADD may be supplied along address line 36. Address signal ADD may be applied to the gates of address transistors ADDT1 and ADDT2.

During a writing operation, address signal ADD is asserted (i.e., signal ADD is driven high), which turns on address transistor ADDT1 connecting node 42 to data line 32 and turns on address transistor ADDT2 connecting node 44 to data line 34. Logic value D on node 42 may assume the value of data signal DATA. Logic value ND on node 44 may assume the value of data signal NDATA. After a data loading operation is complete, address signal ADD may be deasserted (e.g. signal ADD is driven low) turning off address transistors ADDT1 and ADDT2 and isolating memory cell 20 from further changes.

For a typical data loading operation, data signals DATA and NDATA have complementary logic values, so that when address signal ADD is asserted, memory cell 20 stores the logic value DATA as logic value D on node 42. However, when data signals DATA and NDATA have the same logic value, there is an ambiguity in what logic value is stored in memory cell 20 when address signal ADD is asserted.

For example, consider the case in which ADD is asserted when data signals DATA and NDATA are both high. Address transistor ADDT1 will want to drive node 42 high, which will turn on turn on transistor TN2 and turn off transistor TP2, driving node 44 low (i.e. to ground voltage Vss). However, address transistor ADDT2 will want to drive node 44 high, turning on address transistor TN1 and turning off address transistor TP1, driving node 42 low. The value that memory cell 20 acquires during such an operation may be controlled by selection of the relative strengths of the transistors in memory cell 20. In particular, the transistors in memory cell 20 may have relative strengths such that if address signal ADD is asserted when data signals DATA and NDATA are both high, memory cell 20 will retain its previous logic value (i.e. the logic value of memory cell 20 before the asserting of address signal ADD). For such a memory cell 20, driving data signals DATA and NDATA may have the effect of insulating memory cell 20 from changes in its stored logic value. The relative strengths of transistors in memory cell 20 may be adjusted by selection of the relative sizes of the transistors (as an example).

After a programmable logic device is loaded with a set of configuration data, the programmable logic device may be reconfigured by loading a different set of configuration data. Sometimes it may be desirable to reconfigure only a portion of the memory cells in a programmable logic device, in a process known as partial reconfiguration. As memory cells are typically arranged in an array, partial reconfiguration can be performed by clearing a rectangular region of the array and loading new data into the cleared region. However, this method does not allow any non-reconfigured logic to exist within the rectangular region, nor does it allow non-reconfigured signals to route through the region, or allow logic or signals to "operate-through" the partial reconfiguration process.

Figure 4:
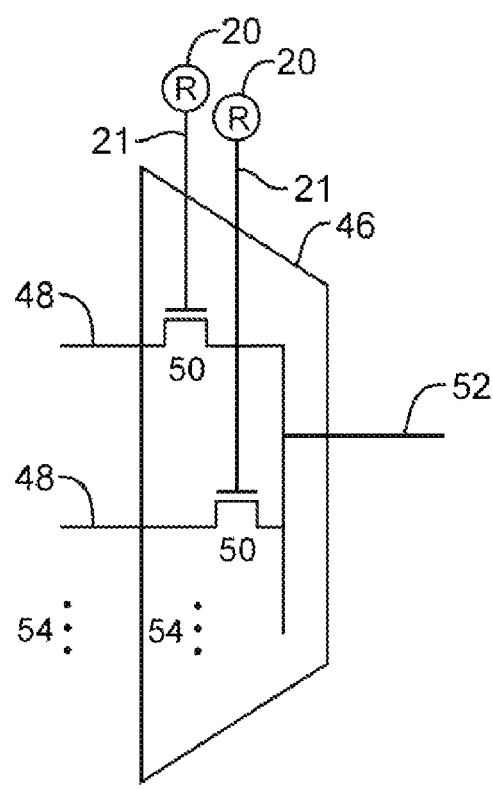
FIG. 4 is a diagram of a multiplexer that may be used in programmable interconnects on a programmable logic device in accordance with an embodiment of the present invention.

When performing partial reconfiguration, it may be desirable to avoid the occurrence of conflicting signals. For example, programmable interconnects 16 (see, e.g., FIG. 1) may typically incorporate multiplexers. The multiplexers may be implemented in whole or in part with one-hot multiplexers. An example of a one-hot multiplexer 46 that may be implemented in programmable interconnects 16 is shown in FIG. 4. Multiplexer 46 has two or more inputs 48. Each input may be connected to a transistor 50. Each transistor 50 may receive a control signal such as a signal from memory cell 20 on a path such as path 21. Additional inputs 48, transistors 50, and memory cells 20 are indicated by dots 54. Multiplexer 46 may have a single output 52 that is connected to each of the transistors 50. Configuration bits stored in memory cells 20 may determine which of the multiple inputs 48 is connected to output 52. Inputs 48 and output 52 may be connected to interconnects or routing lines in programmable logic device 10.

When a memory cell 20 in FIG. 4 is storing a logic high value, it is said to be "enabled." Typically, only one of the memory cells 20 is storing a logic high, so that only one of the transistors 50 is on, and output 52 is connected to only one of inputs 48. If more than one memory cell 20 is storing a logic high, then conflicting signals may result. For example, if two memory cells 20 are storing a logic high, with their respective transistors 50 enabled, input signals from two different inputs 48 may be connected to the single output 52. In such a situation, the two memory cells 20 storing the logic high values are said to be "conflicting" or "in electrical contention." It would be desirable to avoid electrical contention.

Typically, memory cells 20 are cleared (i.e. set to 0) before configuration data is loaded in a reconfiguration process. If memory cells 20 are not cleared before data loading, electrical contention may arise. For example, consider the situation in which a first memory cell 20 of multiplexer 46 is low and a second memory cell 20 of multiplexer 26 is high. A user may desire to load a new set of configuration data that changes the loaded values such that the first memory cell 20 of multiplexer 46 switches from low to high and the second memory cell 20 of multiplexer 26 switches from high to low. Configuration data is loaded sequentially row by row (see, e.g., FIG. 1). As a result, the states of the two memory cells 20 may be changed sequentially and not simultaneously (e.g., if the two memory cells 20 are situated in two different rows of memory cell array 20 of FIG. 1). If the first memory cell 20 is written before the second, then a case of electrical contention may arise in which momentarily both the first and second memory cells 20 are storing a logic high. Clearing memory cells 20 before a writing operation would prevent such a situation from arising. Another method would be to drive all routing lines to the same logic value (i.e., so that inputs 48 and output 52 have the same logic value) so that contention does not arise when multiple memory cells 20 are enabled.

To avoid disrupting operation of the system in which the programmable device is operating, it would be desirable to load only a portion of a set of configuration data, and to perform partial reconfiguration of memory array 28 as opposed to a full reconfiguration. A conventional implementation of a partial reconfiguration process would involve a partial reconfiguration of a rectangular region of memory cells 20. For example, for memory cells 20 in array 28 in FIG. 5, a rectangular region 56 might be selectively cleared and reconfigured with new configuration data. The ability to reconfigure only memory cells in a rectangular region of array 28 can, however, be limiting. In particular, a logic designer will not be able to route sensitive functions through a block that might be reconfigured, because the reconfiguration process might disrupt the sensitive function. Designers may therefore be forced to use suboptimal circuit layouts just to permit partial reconfiguration operations. Forcing logic into various rectangular regions to accommodate block-based partial reconfiguration can significantly reduce the routability and utilization of both the reconfigured and non-reconfigured portions of a design.

Figure 5:
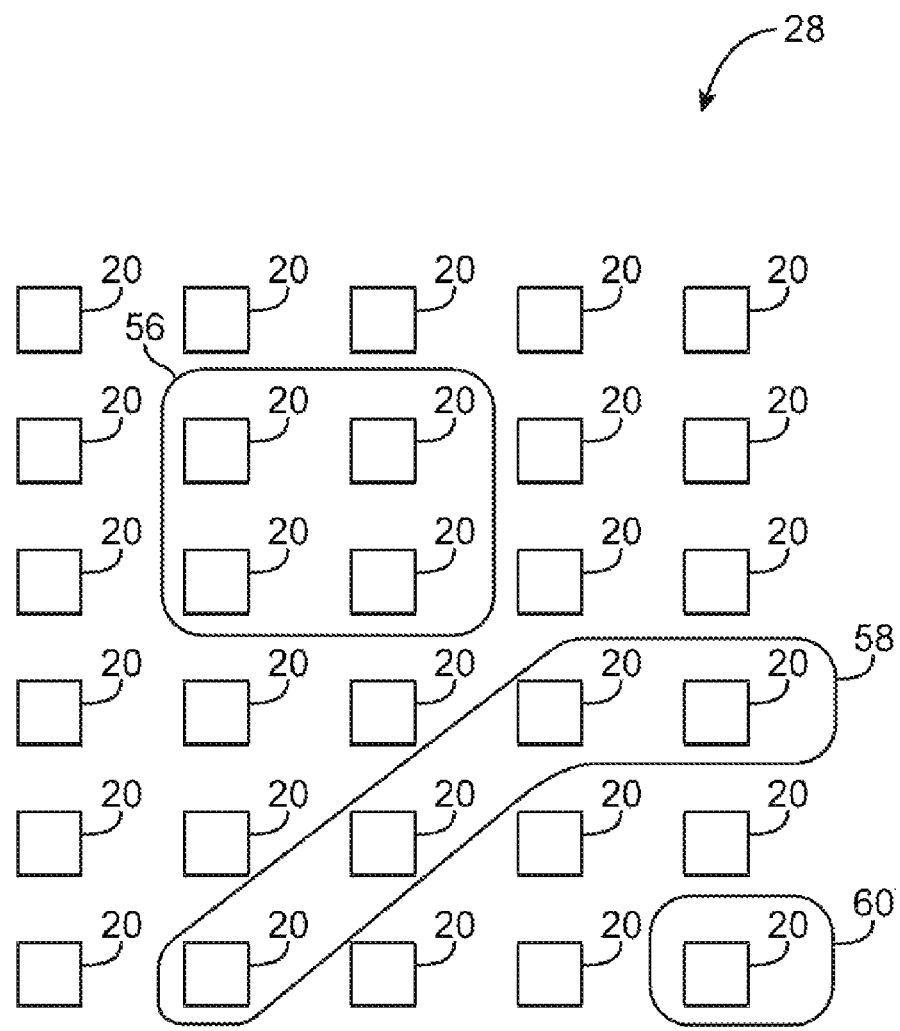
FIG. 5 is a diagram of regions in a memory cell array that may be reconfigured during a partial reconfiguration of the memory cell array in accordance with an embodiment of the present invention.

It would therefore be desirable to be able to reconfigure non-rectangular regions such as region 58 of FIG. 5, or to reconfigure non-contiguous regions such as combined regions of 58 and 60, while allowing non-reconfigured memory cell regions to operate uninterrupted during a partial reconfiguration process.

Figure 6:
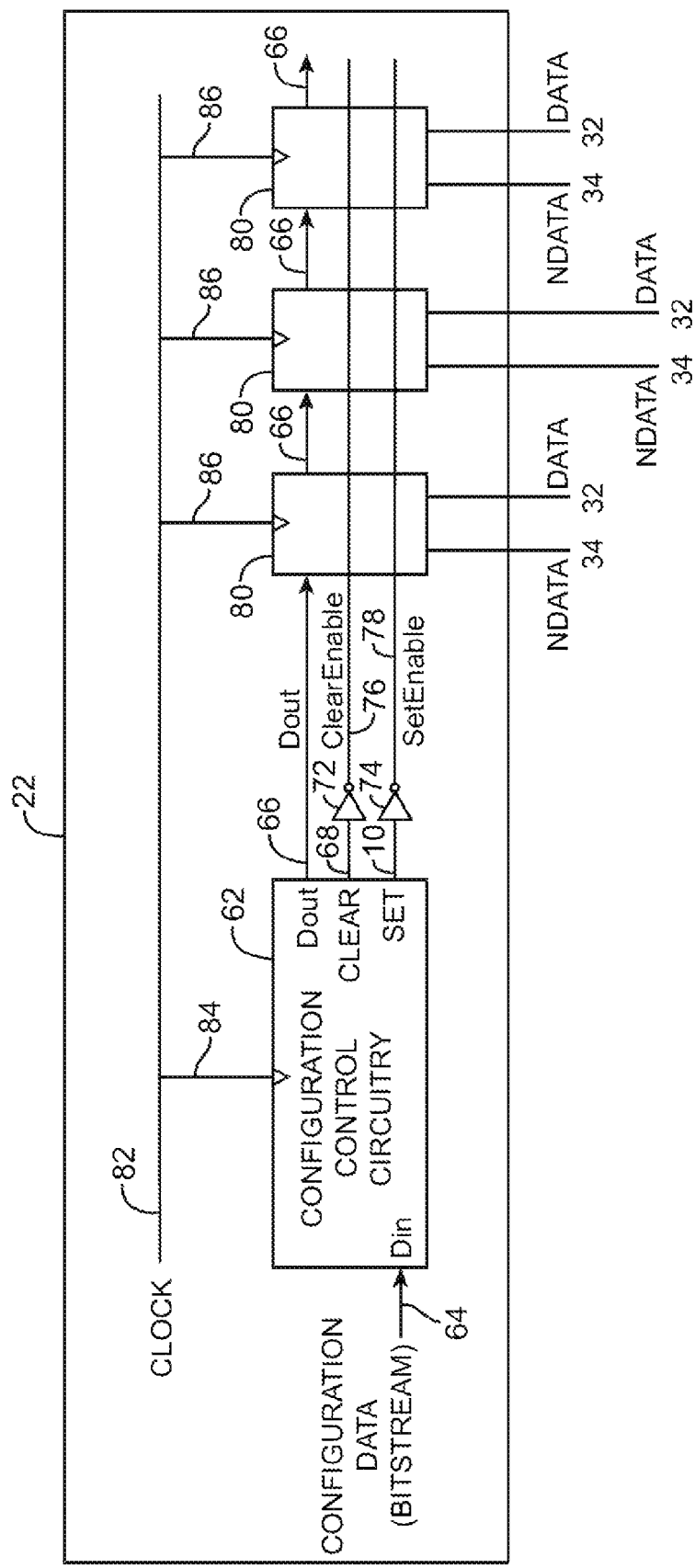
FIG. 6 is a diagram of data register circuitry that has configuration control circuitry and data line circuitry in accordance with an embodiment of the present invention.

These goals may be realized by providing device 10 with data register circuitry 22 that enables partial-reconfiguration of memory cell array 28. FIG. 6 shows data register circuitry 22 that is capable of a partial reconfiguration of memory cell array 28. Data register circuitry 22 may have configuration control circuitry 62.

Circuitry 62 may receive control signals from an external configuration device or may, if desired, be incorporated into an external device. Circuitry 62 may receive a stream of configuration data BITSREAM on a path 64 (e.g., from an external configuration device). Circuitry 62 may output a corresponding data signal Dout on path 66, and configuration control signals CLEAR on path 68 and SET on path 70. Inverter 72 may receive control signal CLEAR on path 68 and output inverted signal ClearEnable on path 76. Inverter 74 may receive control signal SET on path 70 and output inverted signal SetEnable on path 78. A clock signal may be provided on path 82 and received on path 84 by circuitry 62.

Data register circuitry 22 may have data line circuitry 80. Each block of data line circuitry 80 may receive data signal Dout on path 66, configuration control signal ClearEnable on path 76 and configuration control signal SetEnable on path 78. Each block of data line circuitry 80 may output configuration data signals on a pair of data lines 32 and 34 that lead to a column of memory cells 20 (see, e.g., FIG. 2). Data signal DATA may be conveyed on path 32 and data signal NDATA may be conveyed on path 34. Data signals DATA and NDATA may be complementary signals or they may have the same logic value. Data line circuitry 80 may receive a clock signal on paths 86 that are connected to path 82.

Figure 7:
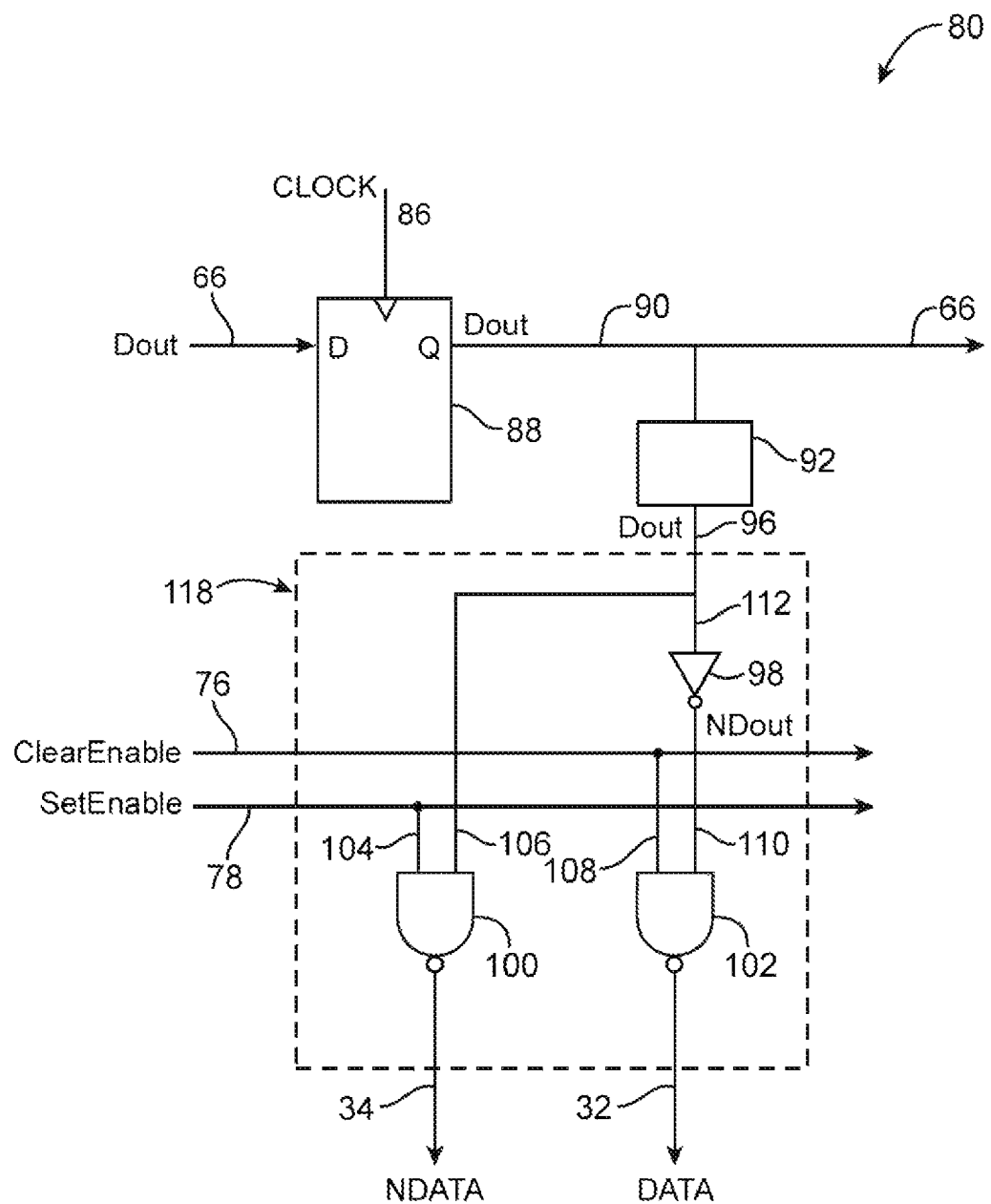
FIG. 7 is a diagram of data line circuitry that has configuration logic circuitry in accordance with an embodiment of the present invention.

Data line circuitry 80 may include shift register circuitry into which configuration data can be loaded during data writing operations. Each block of circuitry 80 may have a configuration of the type shown in FIG. 7. In particular, data line circuitry 80 may have a register 88 that receives data signal Dout on a path 66. Register 88 may receive a clock signal on a path 86. Register 88 may output a signal Dout out a path 90. Path 90 may be connected to optional isolation register circuitry 92 that may be used to help isolate data signal Dout from memory array 28 (see, e.g., FIG. 1). Optional isolation register circuitry 92 may supply data signal Dout on a path 96.

Data line circuitry 80 may have configuration logic circuitry 118. Configuration logic circuitry 118 may receive configuration control signals ClearEnable on path 76 and SetEnable on path 78. Configuration logic circuitry 118 may receive data signal Dout on path 96. In response, configuration logic circuitry 118 may output data signal DATA on path 32 and data signal NDATA on path 34. Path 96 may be connected to input path 112 of an inverter 98. Inverter 98 may invert data signal Dout and output inverted signal NDout on a path 110. Logic NAND gate may receive signal NDout on input path 110 and may receive configuration control signal ClearEnable on an input path 108 that is connected to path 76. Logic NAND gate 102 may output data signal DATA on data line 32. Logic NAND gate 100 may receive data signal Dout on an input path 106 and may receive configuration control signal SetEnable on an input path 104 that is connected to path 78. Logic NAND gate 100 may output data signal NDATA on data line 34. Data lines 32 and 34 provide data signals DATA and NDATA, respectively, to a column of memory cells 20 in memory cell array 28 (see, e.g., FIG. 2).

Configuration logic circuitry 118 may function according to the table shown in FIG. 8. Input signals to configuration logic circuitry 118 are configuration control signals ClearEnable and SetEnable, and data signal Dout. In response, configuration logic circuitry 118 outputs data signals DATA and NDATA. Also shown is the value that may be stored in a memory cell 20 for given values of DATA and NDATA, when address signal ADD is asserted for the memory cell 20 (see, e.g., FIG. 3).

The logic NAND of two inputs will result in logic 0 if and only if both inputs are logic 1. From FIG. 7, signal NDATA will be logic 0 if and only if signals SetEnable and Dout are logic 1 (i.e., for cases F and H of FIG. 8), and will result in a logic 1 otherwise (i.e., for cases A-E and G of FIG. 8). From FIG. 7, signal DATA will be logic 0 if and only if signals ClearEnable and NDout (the complement of Dout) are both logic 1 (i.e., when ClearEnable is logic 1 and Dout is logic 0) as shown for cases C and G of FIG. 8. Signal DATA is logic 1 otherwise, as shown for cases A, B, D-F, and H in FIG. 8.

As can be seen in FIG. 8, when SetEnable and ClearEnable are both high (cases G and H of FIG. 8), the value of DATA will be Dout, and the value of NDATA will be the complement of Dout (i.e., NDout). When these values of DATA and NDATA are passed on lines 32 and 34, respectively, to memory cells 20, memory cell 20 will assume the value of Dout, as shown in the last column for cases G and H in FIG. 8.

When ClearEnable is set to 0, ClearEnable may be said to be deasserted, and DATA will be forced high regardless of the state of SetEnable. When SetEnable is set to 0, SetEnable may be said to be deasserted and NDATA will be forced high regardless of the state of ClearEnable. Similarly, control signal CLEAR is asserted when it is driven high, and control signal SET is asserted when it is driven high (see, e.g., FIG. 6).

When both DATA and NDATA are high, a memory cell 20 that is previously storing a given value will maintain that previously stored value and will not flip its state. To indicate this, the memory cell stored value is listed as "UNDISTURBED" in the table of FIG. 8 for cases A, B, D, and E.

When control signal ClearEnable is deasserted (ClearEnable is low), data signal DATA is taken high. This prevents a memory cell 20 that receives data signal DATA from having a logic 0 written into it even if the memory cell contains a "1". When data signal DATA is high and NDATA is high while ClearEnable is deasserted, memory cell 20 will also be undisturbed. When data signal DATA is high and NDATA is low while ClearEnable is deasserted (case F), a logic 1 will be written to memory cell 20.

When control signal SetEnable is deasserted (SetEnable is low), data signal NDATA is taken high. This prevents a memory cell 20 that receives data signal DATA from having logic 1 written to it even if the cell contains a "0". When data signal NDATA is high and DATA is high while SetEnable is deasserted, memory cell 20 will be undisturbed. When data signal NDATA is high and DATA is low while SetEnable is deasserted (case C), a logic 0 will be written to memory cell 20.

In other words, deasserting ClearEnable prevents a memory cell from being cleared and deasserting SetEnable prevents a memory cell from being set (i.e. loaded with a logic 1).

Configuration control circuitry 62 and configuration logic circuitry 118 may be used in a variety of ways to successfully implement partial reconfiguration of memory array 28 without disturbing the operation of logic circuitry that is being controlled by unreconfigured cells.

Figure 9:
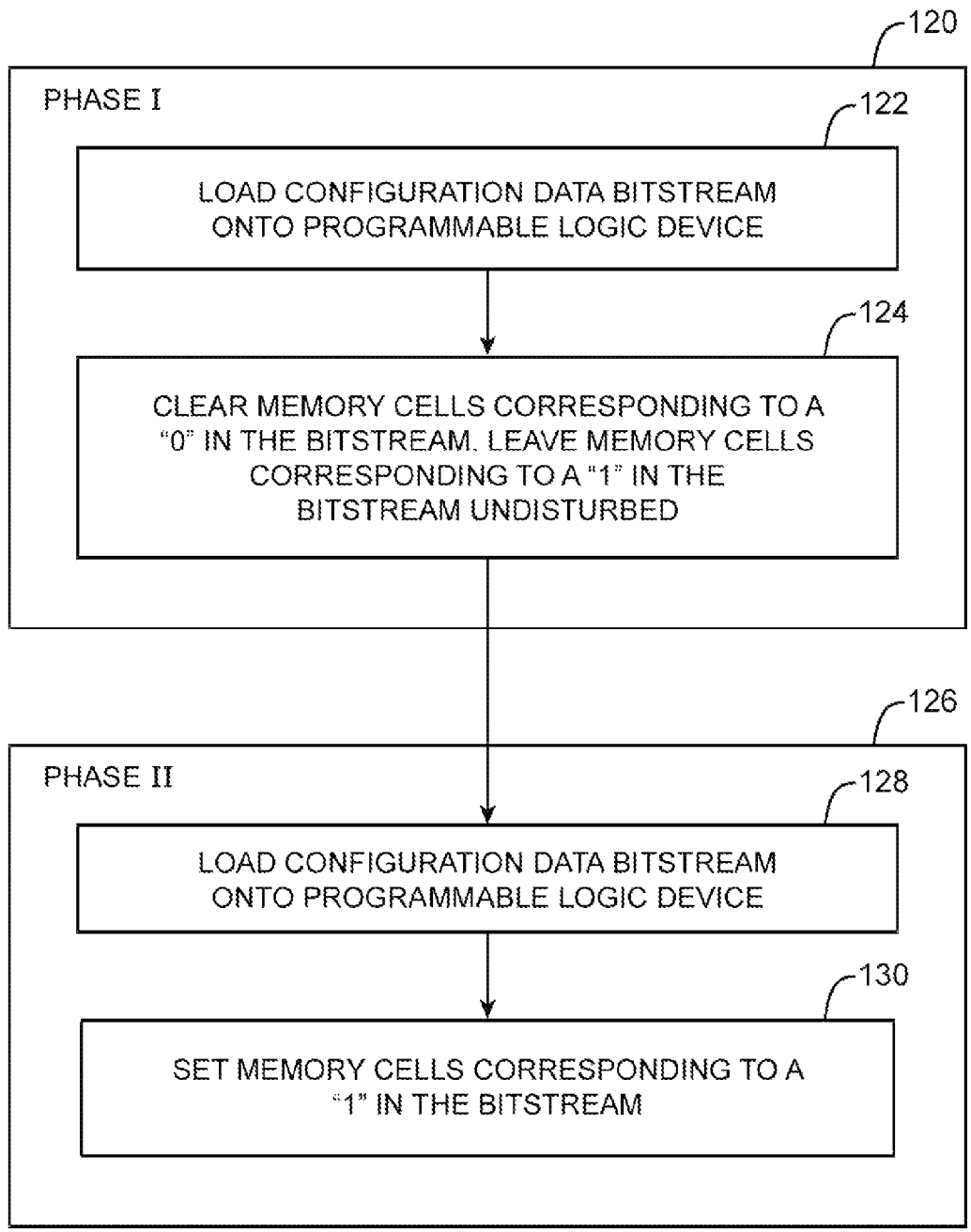
FIG. 9 is a flow chart showing how partial reconfiguration may be performed in two phases, in which in the first phase logic 0 is written to memory cells corresponding to logic 0 in the incoming bitstream in accordance with an embodiment of the present invention.

One procedure that may be used is shown in FIG. 9. A first phase (Phase I) is shown in step 120 of FIG. 9. In step 122, configuration data is loaded onto programmable logic device 10. The configuration data may be in a form of a configuration data bitstream BITSTREAM provided on path 64 of FIG. 6. Configuration control circuitry 62 may provide a data signal Dout (line 66) that is the same as data signal BITSTREAM received at line 64.

In step 124, memory cells that correspond to a 0 in the bitstream are cleared. In particular, configuration control circuitry 62 (of FIG. 6) may take control signal SET high and may take control signal CLEAR low. Equivalently, control signal SetEnable is set to 0 (SetEnable is deasserted) and ClearEnable is set to 1 (ClearEnable is asserted). This corresponds to cases C and D in FIG. 8. Memory cells that correspond to incoming configuration bits of logic 0 (i.e. Dout=0) are set to 0, as indicated for case C. These include memory cells 20 that were previously storing a logic 1 as well as memory cells 20 that were previously storing a logic 0. Memory cells that 20 correspond to an incoming configuration bit of a logic 1 (i.e. Dout=1) remain undisturbed as indicated in case D of FIG. 8. Memory cells for case D that were originally storing a logic 0 will continue storing a logic 0, and memory cells originally storing a logic 1 will continue storing a logic 1. These operations may be applied to appropriate rows in array 28 by asserting appropriate address signals ADD (e.g., to cover a region such as region 58 of FIG. 5).

Phase II is represented by step 126 in FIG. 9. In Phase II, the configuration data from Phase I is loaded into programmable logic device 10 (e.g., for an external configuration device). In step 130, memory cells that correspond to an incoming configuration bit of a logic 1 are set to a logic 1. This may be achieved by driving ClearEnable to logic 0 (deasserting ClearEnable) and by driving SetEnable to a logic 1 (asserting SetEnable), as in cases E and F of FIG. 8. Memory cells 20 that correspond to Dout values of logic 1 will be set to logic 1, whereas memory cells 20 that correspond to Dout of logic 0 will remain undisturbed. As memory cells 20 that correspond to Dout of logic 0 were cleared to 0 in step 1, all memory cells in array 28 will have their correct values following the set operations of step 126.

Alternatively, in step 130 of FIG. 9, ClearEnable may be set to logic 1 (asserting ClearEnable) and SetEnable may be set to logic 1 (asserting ClearEnable). This corresponds to cases G and H of FIG. 8. Memory cells 20 that correspond to Dout of logic 0 will be cleared to logic 0, and memory cells 20 that correspond to Dout of logic 1 will be set to logic 1. All memory cells in array 28 will now be storing their correct values.

Using the procedure outlined in FIG. 9, memory cells that do not receive a new configuration bit that is different from a previously stored configuration bit (i.e., a non-reconfigured memory cell) will not be disturbed during a partial reconfiguration of the memory cell array. For example, consider an unreconfigured memory cell 20 previously storing a logic 0. The memory cell will receive an incoming configuration bit Dout of logic 0 value in the bitstream. In Phase I, this memory cell will be cleared to a logic 0 value, and in Phase II this memory cell will remain undisturbed. The memory cell of this example will therefore retain its value of logic 0 during each stage of the partial reconfiguration process. Similarly, a non-reconfigured memory cell 20 that is storing a logic 1 will receive a configuration bit of logic 1 as Dout. In Phase I, this memory cell will remain undisturbed and in Phase II, this memory cell will be set to a logic 1. The memory cell of this example will therefore retain its value of logic 1 during a partial reconfiguration of the memory cell array. These non-reconfigured memory cells 20 can continue to operate during the partial reconfiguration process.

The procedure of FIG. 9 also avoids electrical contention. For example, consider a scenario in which memory cell A has a previously stored value of logic 0 and is to receive a value of logic 1 in the incoming bitstream and in which memory cell B has a previously stored value of logic 1 and is to receive a value of logic 0 in the incoming bitstream. During Phase I, memory cell B will be cleared to logic 0 and memory cell A will remain undisturbed. During Phase II, memory cell A will be set to logic 1 and memory cell B will retain its newly stored value of logic 0. At no time during the reconfiguration process will memory cells A and B both have a logic 1 value. Thus electrical contention is avoided.

Figure 10:
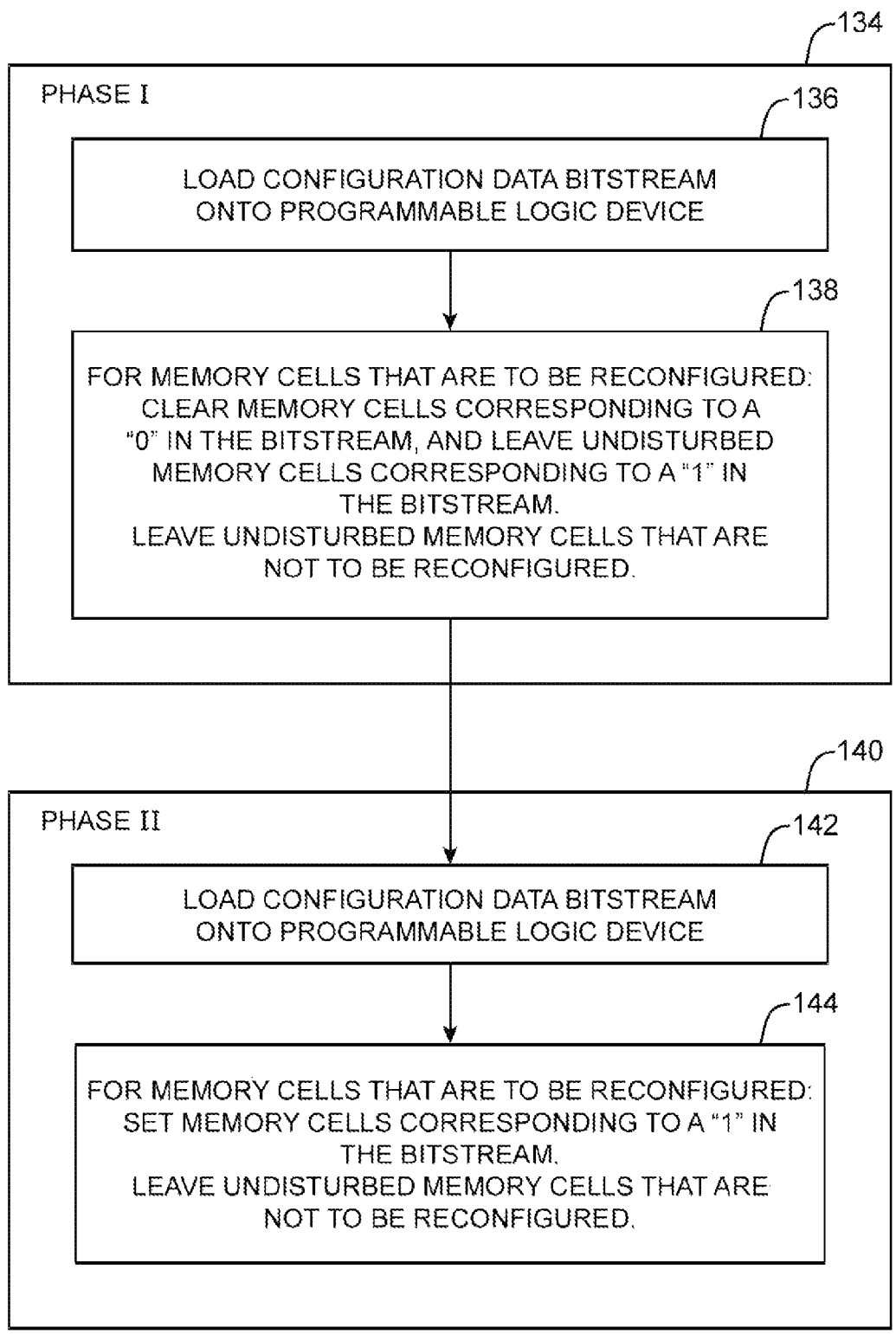
FIG. 10 is a flow chart showing how partial reconfiguration may be performed in two phases, in which memory cells corresponding to unchanged configuration bits are left undisturbed in accordance with an embodiment of the present invention.

Another illustrative partial reconfiguration process is shown in FIG. 10. The procedure shown in FIG. 10 also has two phases. Phase I is shown as step 134. In Phase I, configuration data is first loaded onto programmable logic device 10 (step 136).

The procedure in FIG. 10 makes a distinction between memory cells that are to be reconfigured and memory cells that are not to be reconfigured. To provide this distinction, configuration control circuitry 62 may be used to provide modified configuration data values of data signal Dout (on a line 66 of FIG. 7) that are different from data signal BITSTREAM (on line 64 of FIG. 6) which corresponds to the unmodified configuration data for device 10. Values of data signal BITSTREAM and Dout are shown in FIG. 11. The selected values 132 correspond to memory cells that are to be reconfigured during the partial reconfiguration process. Values outside the selected region may correspond to memory cells that are to remain undisturbed during the partial reconfiguration process.

In PHASE I, reconfiguration control circuitry 62 may provide modified values of Dout as shown in the second line of FIG. 11. These values of Dout may correspond to the BITSTREAM for values within selected region 132 (i.e., those memory cells that are to be reconfigured). Outside the selected region, values of Dout may be driven to logic 1 during phase I and to logic 0 during phase II. Region 132 in FIG. 11 is shown as a contiguous region but it need not be a contiguous region.

In PHASE I, control signal ClearEnable may be driven to logic 1 (ClearEnable is asserted) and control signal SetEnable may be driven to 0 (SetEnable is deasserted). For memory cells 20 lying inside selected region 132, this corresponds to cases C and D of FIG. 8. The memory cells within selected region 132 that are to receive a logic 0 in the incoming bitstream will be cleared to logic 0, whereas memory cells that are to receive a logic 1 in the incoming bitstream will retain their previously stored value, whether logic 0 or logic 1. However, for memory cells 20 that lie outside region 132 of FIG. 11, case D of FIG. 8 will always apply as their values of Dout will always be logic 1 regardless of the corresponding bit in the incoming bitstream. Thus, memory cells 20 that are not to be reconfigured will remain undisturbed.

In PHASE II (step 140 of FIG. 10), configuration data is again loaded (step 142). This configuration data is the same configuration data (BITSTREAM) that was loaded in step 136. Configuration control circuitry 62 provides modified values of Dout shown by the third line FIG. 11. For configuration bits that lie within the selected region of 132—i.e. those bits to be reconfigured—the values of Dout correspond to the BITSTREAM values. However, for non-reconfigured memory cells outside the selected region 132, configuration control circuitry 62 provides values of logic 0 as Dout regardless of corresponding values of bits in the bitstream.

During PHASE II, Control signal ClearEnable may be set to 0 (ClearEnable is deasserted) and SetEnable may be set to 1 (SetEnable is asserted). For memory cells that correspond to values within selected region 132, this is represented by cases E and F of FIG. 8. Memory cells that are to receive a logic 1 will be set to logic 1, while memory cells that are to receive a logic 0 will be cleared to logic 0. However, memory cells that correspond to values outside selected region 132 of FIG. 11 will correspond to case E of FIG. 8 in which Dout is always logic 0, and these memory cells will remain undisturbed in phase II.

In the procedure described in connection with FIG. 10, memory cells that are not to be reconfigured receive high DATA and NDATA signals and are undisturbed throughout the partial reconfiguration process. Such memory cells and their associated programmable logic 18 may continue to operate normally during the partial reconfiguration process. For reconfigured memory cells (within region 132), memory cells that correspond to an incoming bit of logic 0 are cleared to logic 0 in the first stage and memory cells that correspond to an incoming bit of logic 1 set to logic 1 in the second stage. This avoids the possibility of electrical contention. The procedure of FIGS. 10 and 11 may be advantageous over the procedure of FIG. 9, in that unreconfigured memory cells 20 are particularly well isolated during the partial reconfiguration process. This may improve their operating performance during the partial reconfiguration process.

The partial reconfiguration described in connection with FIGS. 9, 10, and 11 may be performed on an entire memory cell array, or may be performed on a rectangular region of a memory cell array, in which the rectangular region may have both reconfigured and non-reconfigured memory cells. The memory cells of FIGS. 8, 10, and 100 need not be SRAM cells but could be other types of programmable elements such as such as erasable programmable read only memory (EPROM) or phase-change memory cells, as long as they can be selectively addressed.

In another illustrative partial reconfiguration procedure, circuitry for selective addressing of individual programmable elements need not be required.

In a first phase, programmable elements previously loaded with old configuration data is loaded with first phase configuration data that is a logical AND of the old configuration data and of the desired new configuration data. Such first phase configuration data would clear to zero those programmable elements that correspond to a logic one in the old configuration data and a logic zero in the new configuration data. Programmable elements that correspond to a logic zero in the old configuration data and a logic one in the new configuration data would be cleared to logic zero and effectively remain unchanged.

In a second phase, the new configuration data is loaded into the programmable elements. Programmable elements that correspond to a logic zero in the old configuration data and a logic one in the new configuration data would be now loaded with logic one. All other programmable elements would be loaded with their previously stored values, effectively remaining unchanged.

Such a partial reconfiguration procedure may have the advantage of being used for programmable elements that cannot be individually loaded. Such programmable elements need not be SRAM cells but could be other types of programmable elements.

The foregoing is merely illustrative of the principles of this invention and various modifications can be made by those skilled in the art without departing from the scope and spirit of the invention.

What is claimed is:

1. Memory circuitry, comprising:
    an array of memory cells, wherein each memory cell has associated first and second data lines; and
    control circuitry that selectively loads new data into a given set of the memory cells in place of old data by maintaining the first and second data lines for a first part of the given set of the memory cells at a given logic value while the given set of memory cells is addressed so that the old data in the first part of the given set of memory cells is undisturbed and by maintaining the first and second data lines for a second part of the given set of memory cells at respective complementary logic values while the given set of memory cells is addressed.

2. The memory circuitry defined in claim 1 wherein the control circuitry comprises first and second lines that receive clear and set signals, respectively.

3. The memory circuitry defined in claim 1 wherein the given logic value comprises a logic one value and wherein the control circuitry is configured to hold the first and second data lines for the first part of the given set of memory cells at the logic one value while the given set of memory cells is addressed so that the first part of the given set of memory cells is undisturbed.

4. The memory circuitry defined in claim 1 wherein each memory cell comprises:
    first and second address transistors that receive an address signal from an associated address line; and
    first and second cross-coupled inverters, wherein in each memory cell, one of the first data lines is connected to an input of the first inverter by the first address transistor and one of the second data lines is connected to an input of the second inverter by the second address transistor.

5. The memory circuitry defined in claim 1 wherein each memory cell in the array of memory cells comprises an output, wherein the array of memory cells contains configuration data, and wherein the outputs of the memory cells provide static control signals based on the configuration data that configure programmable logic.

6. The memory circuitry defined in claim 1, wherein the control circuitry comprises an input that receives the new data in a configuration data bitstream and produces corresponding signals on the first and second data lines to selectively reconfigure the array of memory cells by leaving the first part of the given set of memory cells undisturbed while reconfiguring the second part of the given set of memory cells based on the new data in the configuration data bitstream.

7. The memory circuitry defined in claim 1 wherein the control circuitry comprises:
    configuration control circuitry that produces set and clear control signals; and
    data line circuitry that provides logic signals to the first and second data lines in response to the set and clear control signals.

8. The memory circuitry defined in claim 7 wherein each memory cell in the array of memory cells comprises an output, wherein the outputs of the memory cells provide static control signals based on data values loaded into the memory cells, and wherein the outputs configure programmable logic on a programmable logic device that contains the array of memory cells.

9. A programmable logic device, comprising:
    programmable logic;
    an array of memory cells, wherein the memory cells are loaded with configuration data and supply corresponding output signals that configure the programmable logic to implement a custom circuit; and circuitry that is configured to perform partial reconfiguration operations on the array of memory cells in which memory cells are only cleared when those memory cells remain cleared during normal operation of the programmable logic device following completion of the partial reconfiguration operations.

10. The programmable logic device defined in claim 9 wherein the array of memory cells comprises rows and columns of memory cells and wherein the circuitry is configured to perform the partial reconfiguration operations on only a set of the memory cells that are not arranged in a rectangular block.

11. The programmable logic device defined in claim 9 wherein each memory cell in the array of memory cells comprises:
   first and second address transistors with which the circuitry addresses the memory cells during the partial reconfiguration operations; and
   a first data line and a second data line that are respectively coupled to the memory cell through the first and second address transistors.

12. The programmable logic device defined in claim 11 wherein the circuitry is configured to clear some of the memory cells during partial reconfiguration operations by holding the first data lines of those memory cells at a given logic value while holding the second data lines of those memory cells at a logic value that is complementary to the given logic value.

13. The programmable logic device defined in claim 12 wherein the circuitry is configured to set some of the memory cells during partial reconfiguration operations by holding the first data lines of those memory cells at the logic value that is complementary to the given logic value while holding the second data lines of those memory cells at the given logic value.

14. The programmable logic device defined in claim 13 wherein the circuitry is configured to leave some of the memory cells undisturbed during partial reconfiguration operations by holding the first and second data lines of those memory cells at the given logic value during partial reconfiguration operations.

15. The programmable logic device defined in claim 14 wherein the circuitry comprises:
   configuration control circuitry that produces set and clear control signals; and
   data line circuitry that provides logic signals to the first and second data lines in response to the set and clear control signals.

16. A method for performing a reconfiguration operation on an array of memory cells so that in a set of the memory cells old configuration data is replaced with new configuration data, the method comprising:
   as part of the reconfiguration operation, loading a first portion of the set of memory cells with a given logic value without disturbing a second portion of the set of memory cells that is different than the first portion, wherein the given logic value loaded into the first portion of the set of memory cells represents the new configuration data for the first portion of the set of memory cells; and
   as part of the reconfiguration operation and after loading the first portion of the set of memory cells with the given logic value, loading the second portion of the set of memory cells with a complement to the given logic value, wherein the complement to the given logic value represents the new configuration data for the second portion of the set of memory cells.

17. The method defined in claim 16 wherein loading the first portion of the set of memory cells comprises loading a logic zero into each of the memory cells in the first portion of memory cells to clear the first portion of the set of memory cells without disturbing the second portion of the set of memory cells.

18. The method defined in claim 17 wherein loading the second portion of the set of memory cells comprises loading a logic one into each of the memory cells in the second portion of the memory cells.

19. The method defined in claim 17 wherein the set of memory cells comprises a subset of the array of memory cells, wherein loading the second portion of the set of memory cells comprises loading a logic one into each of the memory cells in the second portion of the memory cells without disturbing the first portion of the set of memory cells and without disturbing any memory cells in the array of memory cells other than the subset of memory cells.

20. The method defined in claim 16 wherein the array of memory cells comprises an array of configuration random-access memory cells on a programmable logic device that has programmable logic, wherein the configuration random-access memory cells have respective outputs at which static control signals are applied to the programmable logic to configure the programmable logic, the method further comprising operating a portion of the programmable logic without interruption during the reconfiguration operation.

21. A method for reconfiguring a subset of an array of configuration data memory cells on a programmable integrated circuit by replacing old configuration data in the subset of configuration data memory cells with new configuration data without disturbing configuration data memory cells in the array that are loaded with configuration data that is not to be reconfigured, comprising:
   during reconfiguration, clearing only those configuration data memory cells in the subset that are to receive a logic zero value in the new configuration data.

22. The method defined in claim 21 further comprising:
   after clearing all of the configuration data memory cells in the subset that are to receive a logic zero value during reconfiguration, setting all of the configuration data memory cells in the subset that are to receive a logic one value during reconfiguration to a logic one value.

23. The method defined in claim 22, wherein clearing and setting of the configuration data memory cells comprises adjusting signal values on first and second data lines in the array in response to clear and set signals provided from control circuitry while addressing the subset of configuration data memory cells.

24. A method for performing a reconfiguration operation on programmable elements in a programmable logic device so that in a given set of the programmable elements old configuration data is replaced with new configuration data, the method comprising:
   in a first phase, selectively clearing a first part of the given set of programmable elements; and
   in a second phase, selectively setting a second part of the given set of programmable elements.

25. The method defined in claim 24, wherein selectively clearing the first part of the given set of programmable elements comprises loading configuration data into the given set of programmable elements that is a logical AND of the old configuration data and the new configuration data.

26. The method defined in claim 25, wherein selectively setting the second part of the given set of programmable elements comprises loading the new configuration data into the given set of programmable elements.

27. The method defined in claim 24, wherein selectively clearing the first part of the given set of programmable elements comprises selectively clearing a rectangular array of the programmable elements.

28. The method defined in claim 24, wherein selectively clearing the first part of the given set of programmable elements comprises using data lines and complementary data lines to clear the first part of the given set of programmable elements.

29. The method defined in claim 24, wherein selectively clearing comprises loading a first set of configuration data that specifies which of the programmable elements are to be selectively cleared and wherein selectively setting comprises loading a second set of configuration data that specifies which of the programmable elements are to be selectively set.

30. The method defined in claim 24, wherein selectively clearing and selectively setting comprise:
   loading a configuration data, wherein selectively clearing comprises clearing programmable elements that correspond to zeros in the configuration data, and wherein selectively setting comprises setting programmable elements that correspond to ones in the configuration data.

* * * * *